US009455734B2

(12) United States Patent
Scherr et al.

(10) Patent No.: US 9,455,734 B2
(45) Date of Patent: *Sep. 27, 2016

(54) SENSOR SYSTEM USING MULTIPLE MODES FOR ANALOG TO DIGITAL CONVERSION

(71) Applicant: Infineon Technologies AG, Neubiberg (DE)

(72) Inventors: Wolfgang Scherr, Villach/Neulandskron (AT); Mario Motz, Wernberg (AT); Christof Bodner, Villach (AT); Laneesh Raghavan, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/018,127

(22) Filed: Feb. 8, 2016

(65) Prior Publication Data

US 2016/0156365 A1 Jun. 2, 2016

Related U.S. Application Data

(63) Continuation-in-part of application No. 14/319,177, filed on Jun. 30, 2014, now Pat. No. 9,258,005.

(51) Int. Cl.
*H03M 1/12* (2006.01)
*H03M 1/00* (2006.01)

(52) U.S. Cl.
CPC ............. *H03M 1/12* (2013.01); *H03M 1/001* (2013.01)

(58) Field of Classification Search
CPC ... H03M 1/001; H03M 1/12; H03M 2201/11
USPC .................................................. 341/155, 156
See application file for complete search history.

(56) References Cited

U.S. PATENT DOCUMENTS

| 4,733,217 | A | | 3/1988 | Dingwall |
| 5,098,200 | A | | 3/1992 | O'Brien et al. |
| 5,302,869 | A | | 4/1994 | Hosotani et al. |
| 5,990,815 | A | * | 11/1999 | Linder ............... H03M 1/0641 341/131 |
| 6,583,747 | B1 | * | 6/2003 | van der Goes .. H03K 17/04106 341/156 |
| 7,135,999 | B2 | | 11/2006 | Kuttner et al. |
| 7,626,531 | B2 | | 12/2009 | Bailey |
| 8,188,901 | B1 | | 5/2012 | Inamdar et al. |
| 8,314,868 | B2 | | 11/2012 | Yamamoto |
| 2004/0155807 | A1 | | 8/2004 | van der Goes et al. |
| 2005/0122247 | A1 | | 6/2005 | Hammerschmidt et al. |

(Continued)

OTHER PUBLICATIONS

Doldan, et al. "A First Order Incremental Analog to Digital Converter Based on Continuous Time Circuits." Proceedings, XVII IMEKO World Congress, Jun. 22-27, 2003, Dubrovnik, Croatia.

(Continued)

*Primary Examiner* — Jean B Jeanglaude
(74) *Attorney, Agent, or Firm* — Eschweiler & Associates, LLC

(57) ABSTRACT

A device for converting analog to digital is disclosed. The device includes a dual mode converter and a control unit. The dual mode converter has a coarse mode and a fine mode. The dual mode converter is configured to receive an input signal and convert the input signal to a digital output having a selected resolution. The control unit is coupled to the dual mode converter and is configured to operate the converter in the coarse mode until a coarse approximation is obtained and to operate the converter in the fine mode until a fine approximation is obtained having the selected resolution. The fine mode includes multi-bit incremental tracking.

19 Claims, 9 Drawing Sheets

(56) References Cited

U.S. PATENT DOCUMENTS

| | | |
|---|---|---|
| 2007/0052570 A1 | 3/2007 | Swerlein et al. |
| 2009/0195432 A1 | 8/2009 | Bailey |
| 2012/0098990 A1 | 4/2012 | Jung et al. |
| 2012/0194367 A1 | 8/2012 | Wang |
| 2012/0274483 A1 | 11/2012 | Pallas Areny et al. |

OTHER PUBLICATIONS

Souri, et al. "A 40 μW CMOS Temperature Sensor with an Inaccuracy of ±0.4° C. (3) from −55° C. to 200° C." IEEE. Published in 2013.

Chae, et al. "A 6.3 μW 20 Bit Incremental Zoom-ADC with 6 ppm INL and 1 μV Offset." IEEE Journal of Solid-State Circuits, vol. 38, No. 12, Dec. 2013.

Non-Final Office Action dated Jun. 10, 2015 for U.S. Appl. No. 14/319,177.

Notice of Allowance dated Oct. 9, 2015 for U.S. Appl. No. 14/319,177.

Chan, et al. "Dynamic Element Matching to Prevent Nonlinear Distortion From Pulse-Shape Mismatches in High-Resolution DACs" IEEE Journal of Solid-State Circuits, vol. 43, No. 9, Sep. 2008.

\* cited by examiner

SENSOR SYSTEM USING MULTIPLE MODES FOR ANALOG TO DIGITAL CONVERSION

REFERENCE TO RELATED APPLICATION

This application is a Continuation-In-Part of U.S. application Ser. No. 14/319,177 filed on Jun. 30, 2014, the contents of which are incorporated by reference in their entirety.

BACKGROUND

Sensors are utilized in sensing systems to detect properties, such as light, temperature, motion, and the like. The sensors are typically configured to measure a property and then provide the measurement in a suitable form. For example, a sensor may measure a magnetic field and then provide the measurement as an output signal.

Typically, sensors include a converter to convert an analog measurement into a digital form or digital value. Then, in one example, the digital measurement is provided as a signal using varied current levels to convey the information.

Sensors are intended to be configured to provide the digital measurements using low power and low noise. This permits their use in low power environments, such as automotive systems. However, the low noise requirement generally uses more power in order to yield higher signal to noise ratios.

DETAILED DESCRIPTION

Figure 1:
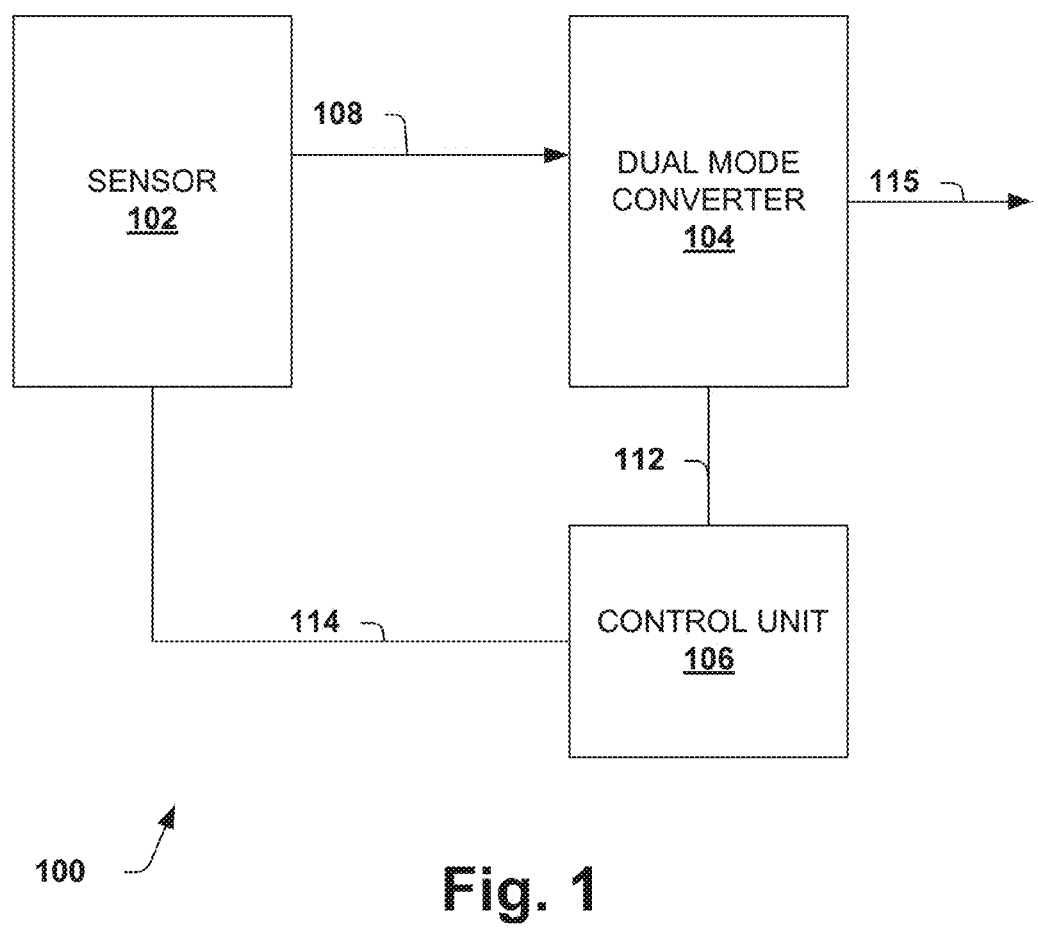
FIG. 1 is a diagram of a sensor device using a dual mode converter for analog to digital conversion.

The present invention will now be described with reference to the attached drawing figures, wherein like reference numerals are used to refer to like elements throughout, and wherein the illustrated structures and devices are not necessarily drawn to scale.

Devices and methods are disclosed that perform analog to digital conversion with low power and high signal to noise by using multiple modes. In a first mode, successive approximation tracking (SAT) is used to quickly narrow down to appropriate values. Subsequently, an incremental tracking mode is used to generate a more accurate value. Additionally, the last value, the digital output can be filtered or averaged to mitigate noise.

FIG. 1 is a diagram of a sensor device 100 incorporating a dual mode converter for analog to digital conversion. The device 100 is provided in a simplified form in order to facilitate understanding. The device 100 is provided as an example of a device for sensing properties, such as temperature, motion, and the like.

The device 100 includes a sensor 102, a dual mode converter 104 and a control unit 106. The sensor element 102 provides one or more sensed values as a signal 108. The values are generated in analog form and convey information about a sensed property, such as motion, speed, temperature and the like. In one example, the values 108 include a voltage and a voltage difference. The voltage difference and the voltage are used along with known voltage dependencies to determine temperatures and the like. It can be assumed that the values 108 remain relatively constant during the conversion.

Small variations can be tracked in the multi-bit incremental mode, so that optional an input alias filter can be omitted.

The sensor element 102 can be one of a variety of sensor elements including, but not limited to magnetic, Hall, temperature, mechanical, stress, voltage, current, and the like type sensor elements.

The conversion of the signal 108 can be initiated by an event or trigger. In one example, the control unit 106 initiates the conversion in response to an external trigger signal. In another example, the control unit 106 initiates the conversion in response to a presents of the signal 108. The conversion can also be performed periodically or cyclically. For example, the conversion can be performed every few microseconds.

In order to conserve power, at least portions of the converter 104 can be powered down or placed in a sleep phase upon completion of the conversion. Additionally, the converter 104 can be switched to operational from the powered down phase or sleep phase as part of initiating a conversion. Furthermore, the converter 104 can be configured for operation with selected duty cycles in order to reduce power consumption. For example, use of the coarse mode leads to a faster conversion thereby reducing power consumption.

The dual mode converter 104 uses a coarse mode using successive approximation tracking (SAT) mode and a fine mode using multi-bit incremental tracking to provide a digital output 115 based on the input signal 108. The coarse mode provides a coarse approximation of the input signal 108 to a low resolution. Furthermore, the coarse mode operates with high bandwidth and speed. In one example, the coarse approximation is to a resolution of 6 bits. In another example, the coarse approximation is to a resolution of about 4 bits. The coarse mode generates successively generates the coarse approximation over a number of cycles until a selected resolution is obtained. Subsequently, the coarse approximation is used in the fine mode to adjust reference values to a small range and to track the reference values in case of small variations of the input signal.

The converter 104 operates in the fine mode, also referred to as the multi-bit incremental mode, to provide a fine approximation at the output 115. The fine mode operates at a lower bandwidth and lower speed than the coarse mode, but substantially reduces noise and operates as an anti aliasing filter. The output 115 can provide a high resolution signal, such as 12 bits, by averaging or filtering the values derived from incremental (or fine mode).

The converter 104 uses multiple bits and the coarse approximation from the coarse mode, referred to as multi-bit incremental tracking, to successively update the fine approximation in the fine mode. Other approaches are limited to single bit feedback changes. However, the multi-bit incremental tracking used in the fine mode used by the converter 104 includes utilizing multiple bits/levels as feedback. Using both modes successively utilizes the speed and high bandwidth of the coarse mode in conjunction with the lower speed, bandwidth but higher accuracy and lower noise of the fine mode. Each of the modes requires a number of cycles to obtain the coarse approximation and the fine approximation. In one example, the converter 104 uses less than 10 cycles for the coarse mode and less than 300 additional cycles for the fine mode.

The control unit 106 is coupled to the converter 104 and the sensor 102. The control unit 106 controls operation of both components. In particular, the control unit 106 initiates operation of the dual mode converter 104 in the coarse mode and switches operation of the converter 104 to the fine mode at the appropriate time.

The device 100 is described with a single sensor element 102 for illustrative purposes. It is appreciated that multiple sensor elements, including sensor elements of varied types, can be coupled to and utilized with the device 100 to derive digital outputs from multiple sensors. In one example, a multiplexor is used to couple multiple sensors to the dual mode converter 104.

Figure 2:
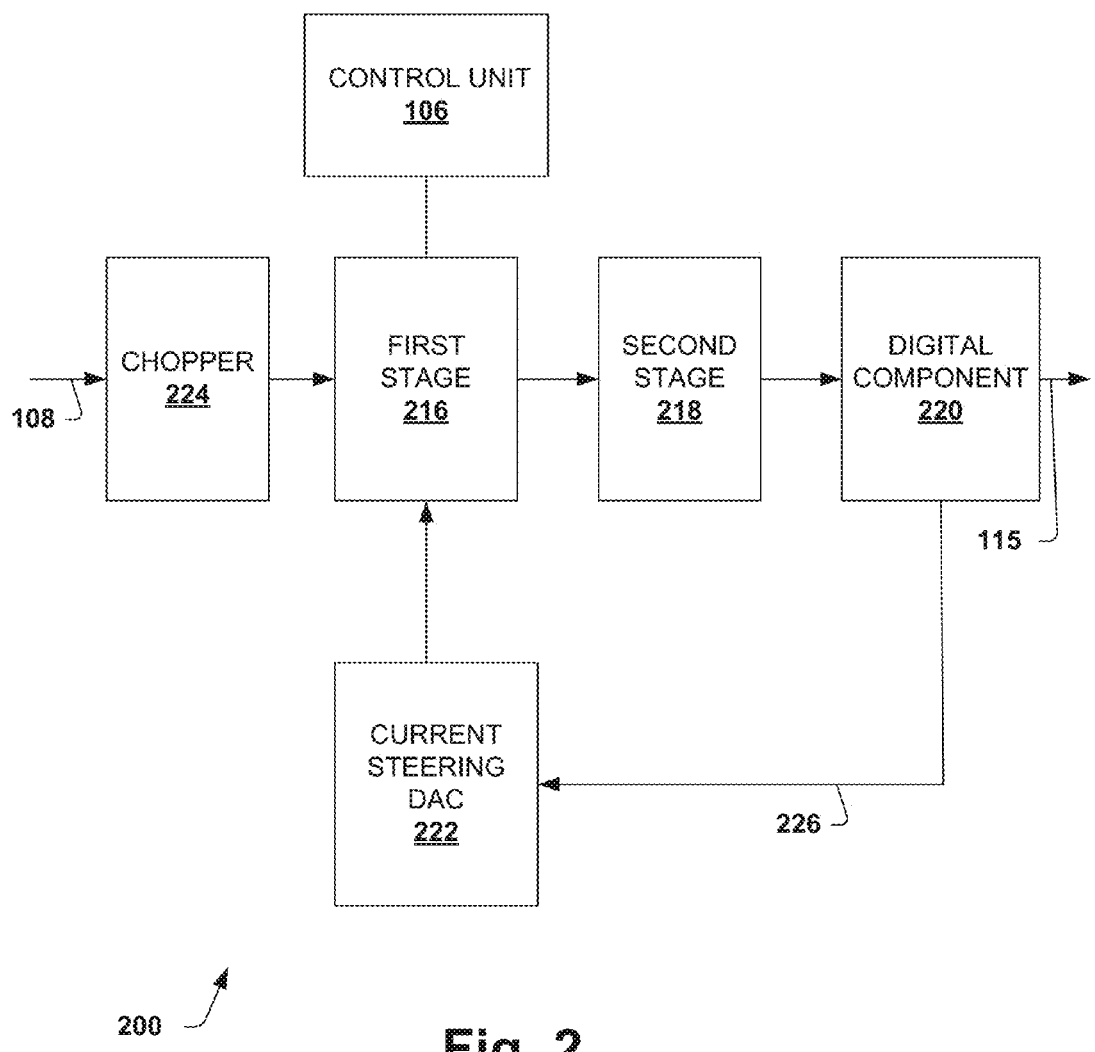
FIG. 2 is a diagram illustrating a dual mode analog to digital converter 200 using multiple modes.

FIG. 2 is a diagram illustrating a dual mode analog to digital converter 200 using multiple modes. The converter uses a fast, coarse mode to generate a low resolution result and uses a slower or integrating, fine mode to generate a high resolution digital output. The converter 200 is presented in a simplified format.

The converter 200 includes a component (chopper, multiplexer or modulator) 224, a first stage 216, a second stage 218, a digital component 220 and, in one example, a current steering or voltage reference digital to analog converter 222. A control unit 106 is provided and controls mode and/or operation of the first stage 216.

The component 224 receives an input signal 108. In one example, the component 224 includes a chopper configured to chop the signal 108 according to a synchronous clock in order to remove noise and/or offsets from the signal and first stage 216. In another example, the component 224 includes a multiplexor configured to receive the signal 108 from one or more sensor elements. An output of the component 224 is provided to the first stage 216.

The first stage 216 operates as a comparator in the coarse mode and operates as an integrator or comparator with reduced bandwidth in high resolution fine mode. The control unit 106 configures the first stage 216 to operate as the comparator or the integrator according to the mode. When operating as a comparator, the first stage 216 compares, relatively fast, an input value with reference values provided by the DAC 222. The first stage 216 generates a fast output, referred to as an approximation, based on the comparison.

When operating as an integrator or as a comparator with reduced bandwidth, the first stage 216 integrates the input value according to reference values provided by the DAC 222. The integrated or low-pass filtered value is provided as the output, also referred to as an approximation, of the first stage 216.

The second stage 218 latches or holds the output of the first stage and provides its output to the digital component 220.

The digital component 220 performs relatively fast successive approximation tracking (SAT) in the SAT mode and slower, but more accurate approximation in the incremental tracking mode. The digital component 220 receives the output of the second stage 218 as its input and provides a highly accurate converted digital value as its output 115.

The digital component 220 generates and provides feedback 226 to the current steering DAC 222 based on the output from the second stage. During the coarse mode, the output is used to update coarse reference values used by the first stage 216. During the fine mode, the output is used to update fine reference values used by the first stage 216. The fine and coarse reference values are. The digital component 220 can, in one example, include an averager, summer or filter for all or a part of the sampled incremental values.

The current steering DAC 222 is configured to receive the feedback signal 226 provides the reference values, also referred to as steering current or values, to the first stage 216. The reference values can be provided in the form of currents or voltages, in one example.

FIG. 3 is a diagram illustrating a dual mode analog to digital converter 300. The converter 300 uses a fast, coarse mode to generate a low resolution result and uses a slower, fine mode to generate a high resolution digital output. The converter 300 is shown additional detail than the above converter 200 shown in FIG. 2.

The converter 300 includes a chopper 224, a first stage 216, a second stage 218, a digital component 220 and a current steering digital to analog converter 222.

The chopper 224 receives an input signal 108. The chopper 224 chops the signal 108 according to a synchronous clock in order to remove noise and/or offsets from the signal, the first stage 216 and optional the DAC 222. Additionally, the chopper 224 further increases accuracy or resolution. The input signal 108 is typically from a sensor, such as a sensor having spinning Hall plates, and can be assumed to be relatively constant during the conversion. An output of the chopper 224 is provided to the first stage 216.

The first stage 216 operates as a comparator in the coarse SAT mode and operates as an integrator in high resolution, fine mode. Switchable capacitors 332a and 332b are coupled to differential outputs of the first stage 216. For the coarse mode, the capacitors are disconnected from the differential outputs. For the fine mode, also referred to as the incremental mode, the capacitors are connected to the differential outputs resulting in an time-continuous integrating function, which reduces alias effects by continuously filtering. The output of the first stage 216 is provided to the second stage 218.

The second stage 218 latches or holds the output of the first stage and provides its output to the digital component 220.

The digital component 220 performs relatively fast successive approximation tracking (SAT) in the SAT mode and slower, but more accurate approximation in the incremental tracking mode. The digital component 220 receives the output of the second stage 218 as its input and provides a highly accurate converted digital value as its output 115.

The digital component 220 includes a logic portion 328 that performs/controls each mode and a digital chopper 330. The logic portion 328 calculates the results and updates the feedback signal 226 for each cycle. The digital chopper 330 removes or mitigates offsets and the like from the feedback signal 226.

The digital component 220 also provides feedback 226 to the current steering DAC 222. The feedback 226 includes coarse or fine reference values for the appropriate mode. The feedback 226 is provided in digital form. The current steering DAC 222 provides the steering values to the first stage 216 in analog form.

As described above, there are multiple modes of operation including a coarse resolution, SAT mode and a fine resolution multi-bit incremental mode. The coarse mode is performed first using the input signal according to a selected bit resolution and generates a result, referred to as a coarse approximation. The result is used for the subsequent, fine resolution mode, which also uses the input signal and generates the digital output signal having a selected resolution.

As alluded to above, the logic portion 328 performs successive approximation in the coarse mode. As appreciated, successive approximation is a method of estimating the value of an unknown quantity by repeated comparison to a sequence of known quantities. Thus in the coarse mode according to one embodiment the step size will typically vary in adjusting the reference values in the feedback 226. In contrast in the fine mode, it is common for a step size employed in subsequent steps to be constant. In accordance with another embodiment of the disclosure, the step size employed in the coarse mode or the fine mode may be variable or constant, and thus not strictly follow the successive approximation principle. For example, in one embodiment the step size may vary linearly, or may vary non-linearly, for example, in accordance with a polynomial or spline function. In one embodiment such a non-linear variation may be employed to contemplate a specific predicted behavior in the incoming signal.

In another embodiment of the disclosure, the same step (i.e., the same set of reference values) may be repeated in the coarse mode or the fine mode, which would be equivalent to a step size of zero. In one embodiment the logic circuit 328 determines whether to increase a next step or keep it the same based on previous results of the first stage 216 (i.e., the comparator results). This consideration of previous comparator results may be advantageous in a case where the input signal is being converted with a significant likelihood that is not yet fully settled and thus a reasonable probability exists that the signal may be exhibiting noise, abrupt signal transitions. In this manner, the logic circuit 328 in the coarse mode is operable to incorporate a dynamic and variable step (e.g., a dynamic, variable integer step) based on some mathematical approximation function, such as a polymonial.

The input chopper 224, which can also be a multiplexer, can provide 2, 4 or 8 input signals in a number of cycles. The number of cycles depends at least partly on the chopper 224 and/or phases of the sensor (e.g., the spinning current phase system of a hall sensor. For example a sequence of 1-2-3-4 where the output is each time processed in coarse and fine mode. The second stage 218 stores and provides the output to the logic 328 and also operations on the synchronous clock. The logic 328 generates a result/approximation and updates reference values, which are provided to the DAC 222 via the feedback signal 226. The logic 328 builds an average or the signed sum of the spinning sequence to cancel the offsets of signal, input stage 216 and spinning offsets from a Hall sensor.

For the fine mode, the first stage 216 operates as an integrator and integrates its input according to changing reference values for a selected number of cycles. In one example, the first stage 216 operates as a continuous time integrator. The variation between reference values, also referred to as the incremental bandwidth, is smaller than that of the coarse mode. The integrated output is provided to the second stage 218, which operates on the synchronous clock. The logic 328, operating in the fine mode, successively approximates a value and updates reference values for the fine mode in each sequence. The logic 328, in one example, uses a counter, such as an up/down counter, in order to update the reference values by multiple bits. In another example, the logic 328 uses digital tracking and/or digital integration to update the reference values by multiple bits. In yet another example, the logic 328 uses digital tracking adaptive to a slope of the input signal. Thus, a higher slope corresponds to a larger step or change in the reference values and a lower slope corresponds to a smaller step or smaller change in the reference values. A selected number of cycles are performed until a fine approximation is obtained. In one example, the fine mode resolution is 12 bits and can further increased by averaging the incremental values and sequences.

As highlighted above, multiple different approaches may be used for tracking using an up/down counter, for example. As highlighted above, the number can adjusted up or down by 1. Alternatively, any number can be added or subtracted to the count. For example, one practical approach may use a value+/$-2^K$ (for K>=0), however, any other integer value could be used and is contemplated as falling within the scope of the disclosure. Such an approach may be useful, for example, if the ADC has to convert and follow rapidly changing signals, wherein the rate of change of the value of the signal is substantial. In such an instance, the ADC may employ a control input to the digital control circuit 328 to provide an option for several different step sizes.

In accordance with another embodiment of the disclosure, the step size of +/−1 may be initially employed in the digital block circuit 328, and then subsequently varied based on a prior history of comparator decisions (i.e., output results of the comparator). For example, if the output of the comparator is the same after multiple comparison operations, then a conclusion may be made that the input signal is changing rapidly, and taking this into account, the circuitry control may increase the step size to more quickly following the signal. In one example, a second counter may be employed to count the number of consecutive comparator output decisions are made one way or another (i.e., a number of consecutive "highs" or a number of consecutive "lows"), and if a count of the second comparator exceeds a predetermined threshold (e.g., three), the present step size is changed to a next step size. Further, upon a toggling of the comparator output (i.e., a change in the result of the comparison), the control circuitry may reset the step size back to 1, or a previous step size, for example.

The values of each sequence phase can be used as start values for the DAC 222 in the following appropriate sequence phase. In a sequence phase 1-2-3-4-1-2-3-4-1-2-3-4 . . . each sequence phase/cycle 1 uses the previous result of sequence phase 1 as start value, to reduce the required step number for the coarse phase. Each sequence phase/cycle contains a coarse and a fine conversion.

In accordance with one embodiment of the disclosure, the current steering DAC 222 may employ dynamic element matching. In such an embodiment, if the current steering DAC 222 employs a binary weighted architecture, wherein a plurality of different current contribution elements (e.g., current mirror circuits) exist for each weighting, a scrambling function or random number generator may be employed so that, on average, different elements or combinations of elements are employed for that same weighting for consecutive conversions. In this manner, any potential mismatches for a given current contribution element are modulated from a DC value to the frequency domain in the form of noise that can then be filtered. In one example, if a binary weight architecture employs four (4) current mirror circuits that have a W/L ratio that each provide 2× a reference current, and four (4) current mirror circuits that have a W/L ratio that each provide 1× the reference current, a scrambling function or random number generator may be employed so that for a given coding that calls for 2 of the 2× current mirrors and 3 of the 1× current mirrors to be activated, over time, different combinations of 2 of the available 2× current mirror circuits are selected, while over time different combinations of 3 of the available 1× current mirror circuits are selected. Further, the dynamic element matching may be employed both in the coarse mode for selection of reference values, as well as in the fine mode for the selection of reference values.

Figure 3A:
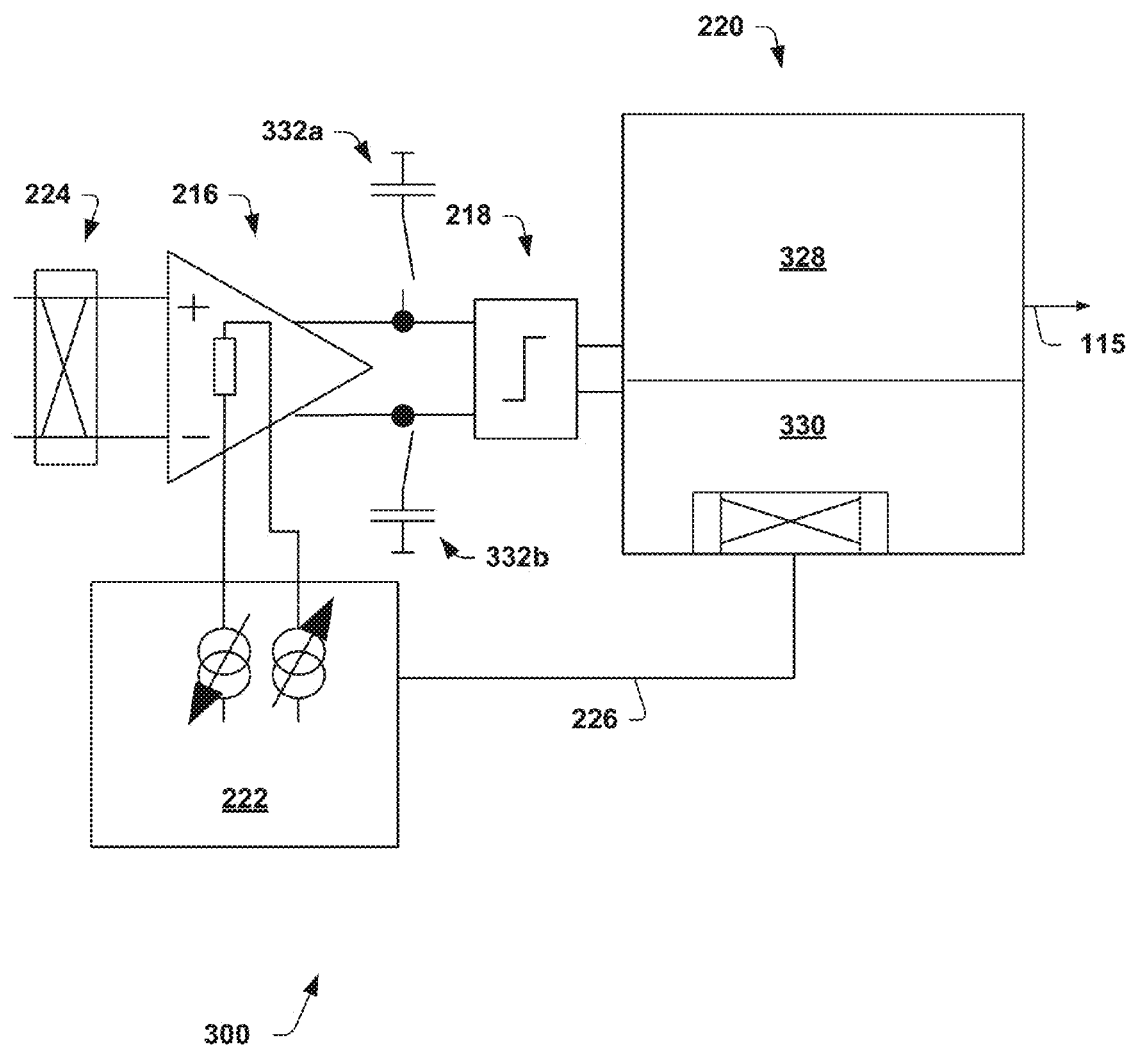
FIG. 3A is a diagram illustrating a differential dual mode analog to digital converter 300.
Figure 3B:
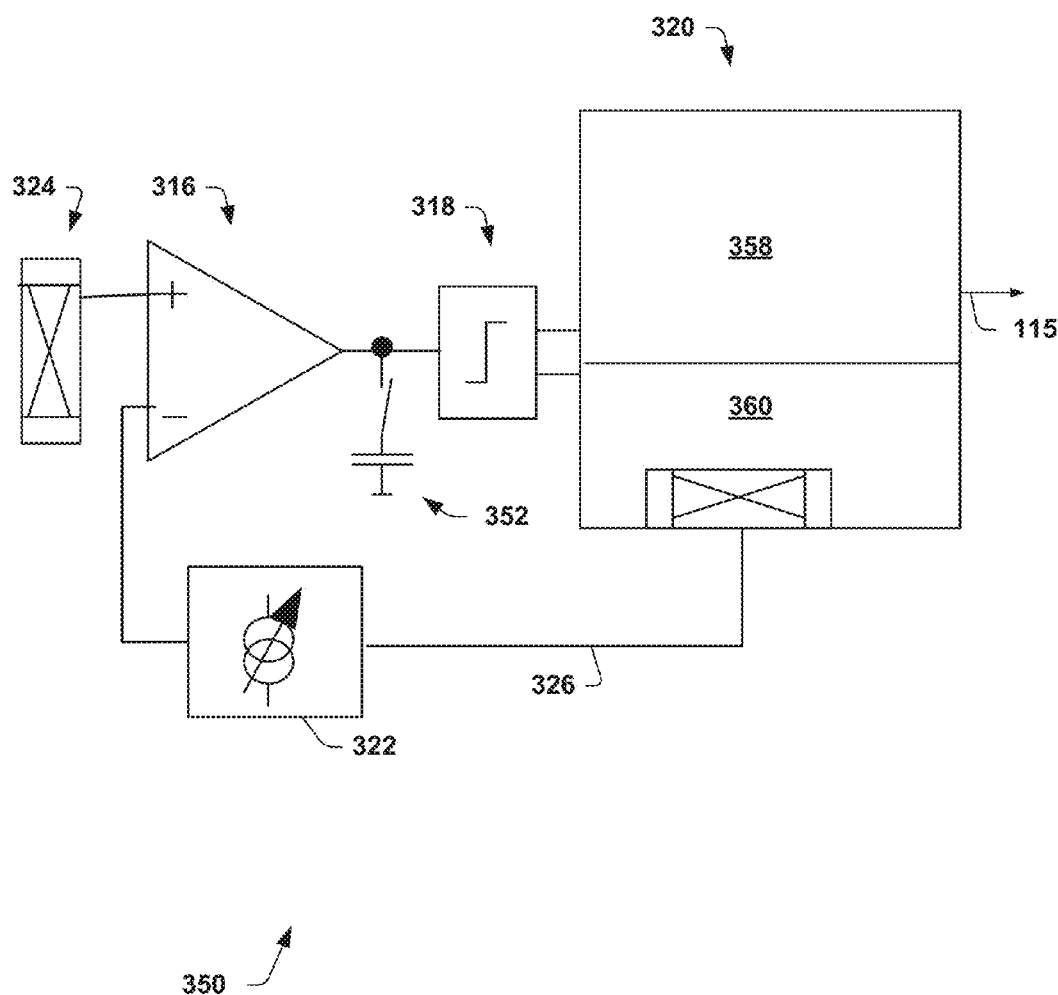
FIG. 3B is a diagram illustrating a single-ended dual mode analog to digital converter 300.

While FIG. 3A illustrates a differential version of a dual mode analog to digital converter 300, it should be appreciated that a single-ended dual mode ADC is also contemplated by the present disclosure, as illustrated in FIG. 3B at 350. As shown, a single-ended chopper 324 receives the single-ended input signal and forwards the processed single-ended input signal to a first stage 315 that compares the input signal to a reference value output from a digital to analog converter 322 such as a current steering DAC.

The first stage 316 operates as a comparator in the coarse SAT mode and as an integrator in the high resolution, fine mode by closing the switch and incorporating the capacitor 352 that operates with the first stage 316 to form an integrator. The single-ended output of the first stage 316 is provided to the second stage 318. The second stage 318 latches and holds the output of the first stage and provides its output to the digital component 320. The digital component provides relatively fast successive approximation tracking (SAT) in the coarse mode and more accurate approximation in the fine or incremental tracking mode. The digital component 320 receives the output of the second stage 318 as its input and provides a highly accurate converter digital value as its output 115.

The digital component 320 includes a logic portion 358 that performs/controls each mode and a digital chopper 360. The logic portion 358 calculates the results and updates the feedback signal 326 for each cycle. The digital chopper 360 removes or mitigates offsets and the like from the feedback signal 326. The feedback 326 generated by the logic portion 358 includes coarse or fine reference values depending on the mode (i.e., coarse or fine). The DAC 322 receives the feedback 326 and generates an analog reference value for the next step. It should be appreciated that while chopping techniques are typically employed with differential signals, the chopping principle optionally may be employed in the single-ended solution of FIG. 3B and such an alternative is contemplated by the present disclosure.

While FIGS. 3A and 3B are both illustrated as employing a current steering type DAC 222/322, alternatively a voltage DAC may be utilized to generate the analog reference values in accordance with the disclosure.

Figure 4A:
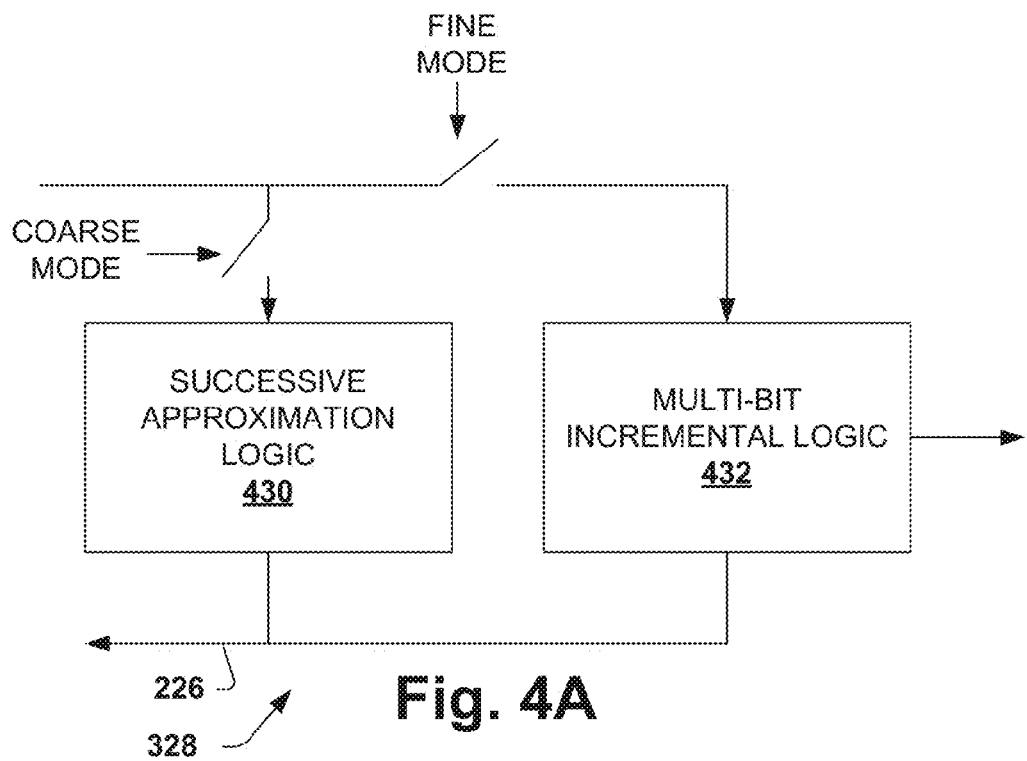
FIG. 4A is a diagram illustrating digital logic of a digital component used in a dual mode converter in accordance with one embodiment.

FIG. 4A is a diagram illustrating digital logic 328 of a digital component used in a dual mode converter. The logic 328 is provided for illustrative purposes and it is appreciated that other suitable configurations are permitted. The logic 328 can be utilized in the above devices and converters and in the methods that follow.

The logic 328 includes successive approximation logic 430 and multi-bit incremental logic 432. The successive approximation logic 430 operates during the coarse mode and controls and performs successive approximation on an input signal.

The multi-bit incremental logic 432 operates during the fine mode and controls multi-bit incremental tracking of the input signal using the coarse mode provided by the successive approximation logic 430. The multi-bit incremental tracking uses multiple bits/levels as feedback to update successive approximations in the fine mode. For example, updated reference values of more than 1 bit are used, such as 7 bits, 12 bits, and the like. Furthermore, the incremental logic 432 can, in one example, also perform filtering and/or averaging in order to reduce the noise, increase the number of bits and output the signal.

Figure 4B:
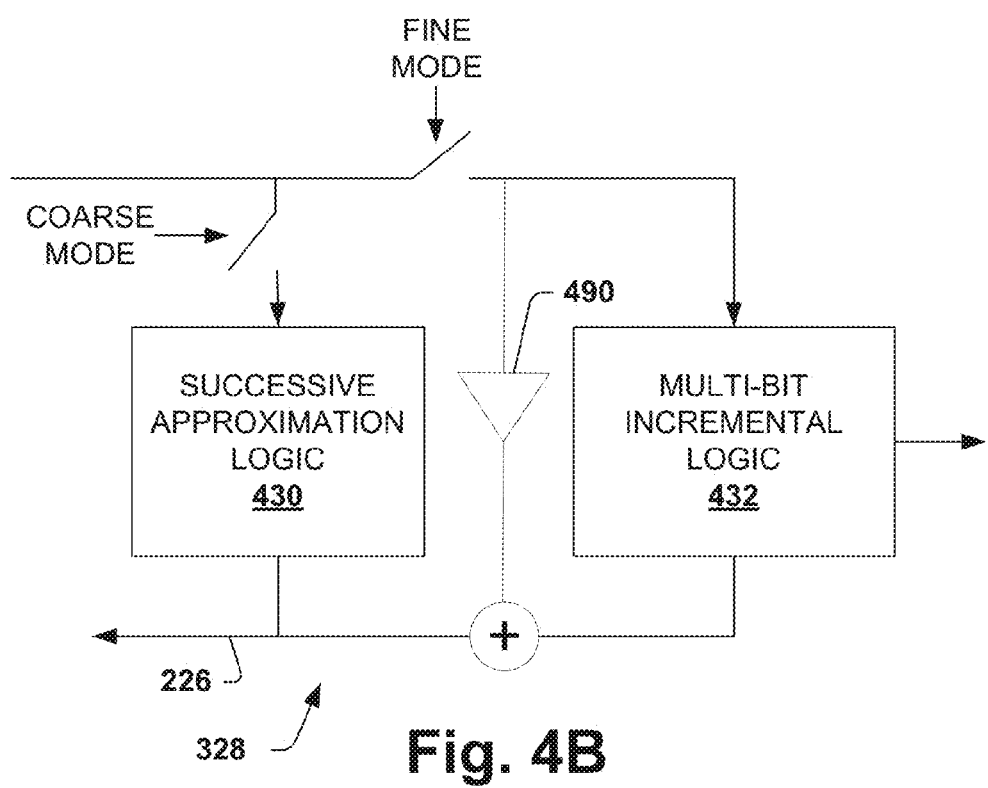
FIG. 4B is a diagram illustrating digital logic of a digital component used in a dual mode converter having a fast feedforward path in parallel with multi-bit incremental logic that are together activated in a fine mode in accordance with one embodiment.

FIG. 4B illustrates a dual mode converter according to another embodiment wherein the logic 328 of a previous embodiment comprises a successive approximation logic that is activated in a coarse mode, and a parallel combination of a feedforward path 490 and a multi-bit incremental logic 432 that is activated in a fine mode. In the embodiment of FIG. 4B, the coarse and fine modes are individually activated using switches 450 and 452, respectively, however other manners of activating and deactivating such circuitry may be employed and all such alternatives are contemplated as falling within the scope of the disclosure.

With the fast feedforward path included with the multi-bit incremental logic 432, the converter is placed in a multi-bit sigma-delta like conversion mode that exhibits typical beneficial noise-shaping characteristics. This means, the converter loop will oscillate. This oscillation will be modulated by the input signal, which causes—especially on input levels between the resolution of the multi-bit DAC—resulting as code density information on the output codes. In addition, the logic 328 may include an up/down counter that operates like a digital integrator. Because the dual mode converter already includes an analog type integrator in the fine mode, the two integrator can cause stability problems. The fast feedforward path 490 provides a +1/−1 type operation based on the comparison results and operates as a proportional part in parallel with the digital integrating function, and thus provides a proportional integral (PI) type compensation, providing a zero in the transfer function, and thus enhancing stability in the loop of the circuitry. The chopping and dynamic element matching as discussed in other embodiments can also be included herein.

As illustrated in FIG. 4B, the combination of the fast forward path 490 and the regular feedback path may cause an instability effect which may need to be addressed. In one embodiment, the second stage 218 or the logic portion 328 further comprises a filter to address such potential instability. In one embodiment the filter comprises a two stage filter, such as a two-stage running average filter. In such a manner, a comparator decision between two results will be filtered out, thus causing a reduction in dynamic changes on the digital to analog converter 222. This may prove advantageous in reducing dynamic side effects in the analog domain.

Figure 5:
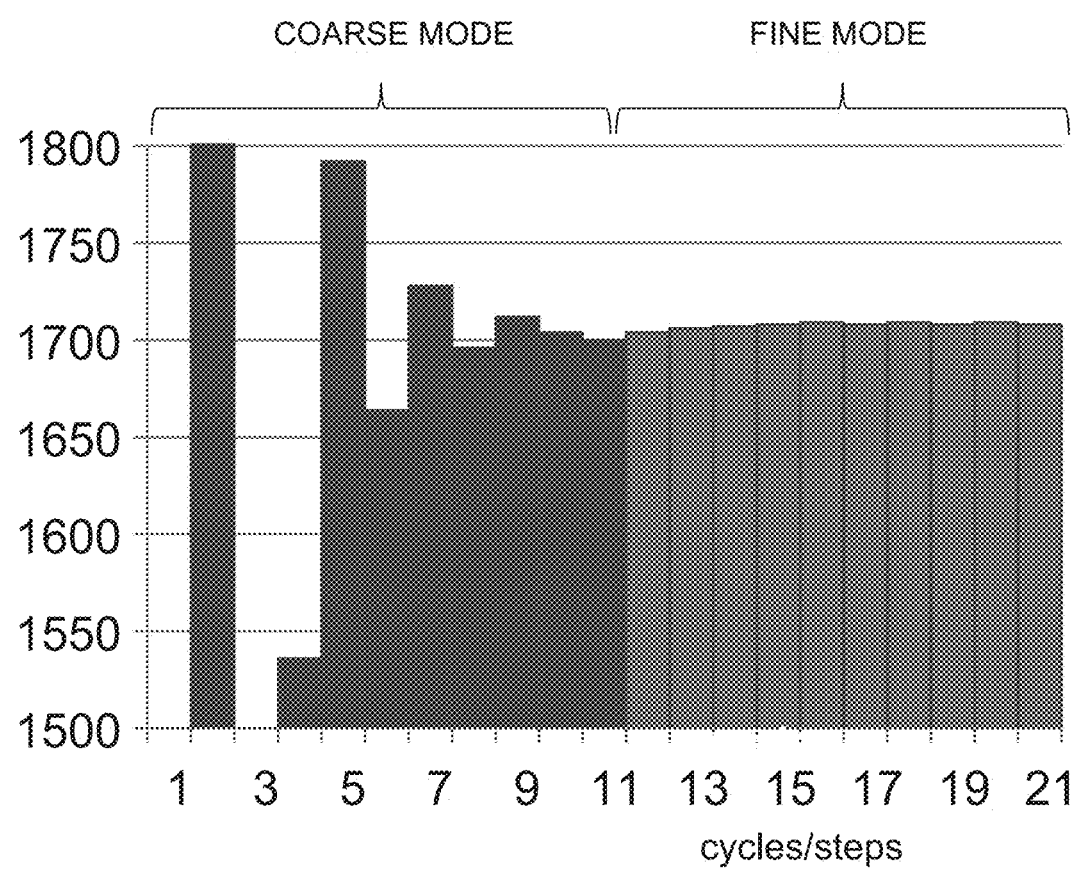
FIG. 5 is a graph depicting an example operation of a dual mode converter.

FIG. 5 is a graph depicting an example operation 500 of a dual mode converter. The example operation 500 can be obtained one of the above dual mode converters, such as converter 200, and/or variations thereof. The operation 500 is provided as an example for illustrative purposes and it is appreciated that other operations having other approximations and values are possible. The coarse mode begins with relatively large changes in reference levels/values, whereas the fine mode provides a final tracking and noise-shaping function with small changes of reference values.

The operation of the converter is based on an input value and operations and cycles performed in the coarse mode and the fine mode. As described above, the coarse mode uses successive approximation to quickly obtain a coarse approximation. For each cycle, updated reference values are chosen and used to make an updated approximation. For example, the digital component 220 can be configured to update reference values based on an approximation. The updated reference values are provided via the DAC 222 for a next approximation. Here, it can be seen that the approximation settles to a stable value in a relatively short number of cycles.

The fine mode uses the coarse approximation as start value for reference values and the resolution of the coarse approximation to set reference values for the fine mode. The reference values have a relatively narrow bandwidth in the fine mode. In the fine mode, the input signal is integrated and noise-shaped like in standard sigma-delta-ADCs, but using multi-bit reference values, which are updated each cycle. The updated reference values are based on the integration of the input signal and a multi-bit incremental tracking. Thus, the fine mode operates with multi-bit incremental tracking and it can be seen that the approximation changes by only relatively small amounts at each cycle. After a suitable number of cycles, a fine approximation is obtained having a selected resolution. The fine approximation is provided as a digital output.

Figure 6:
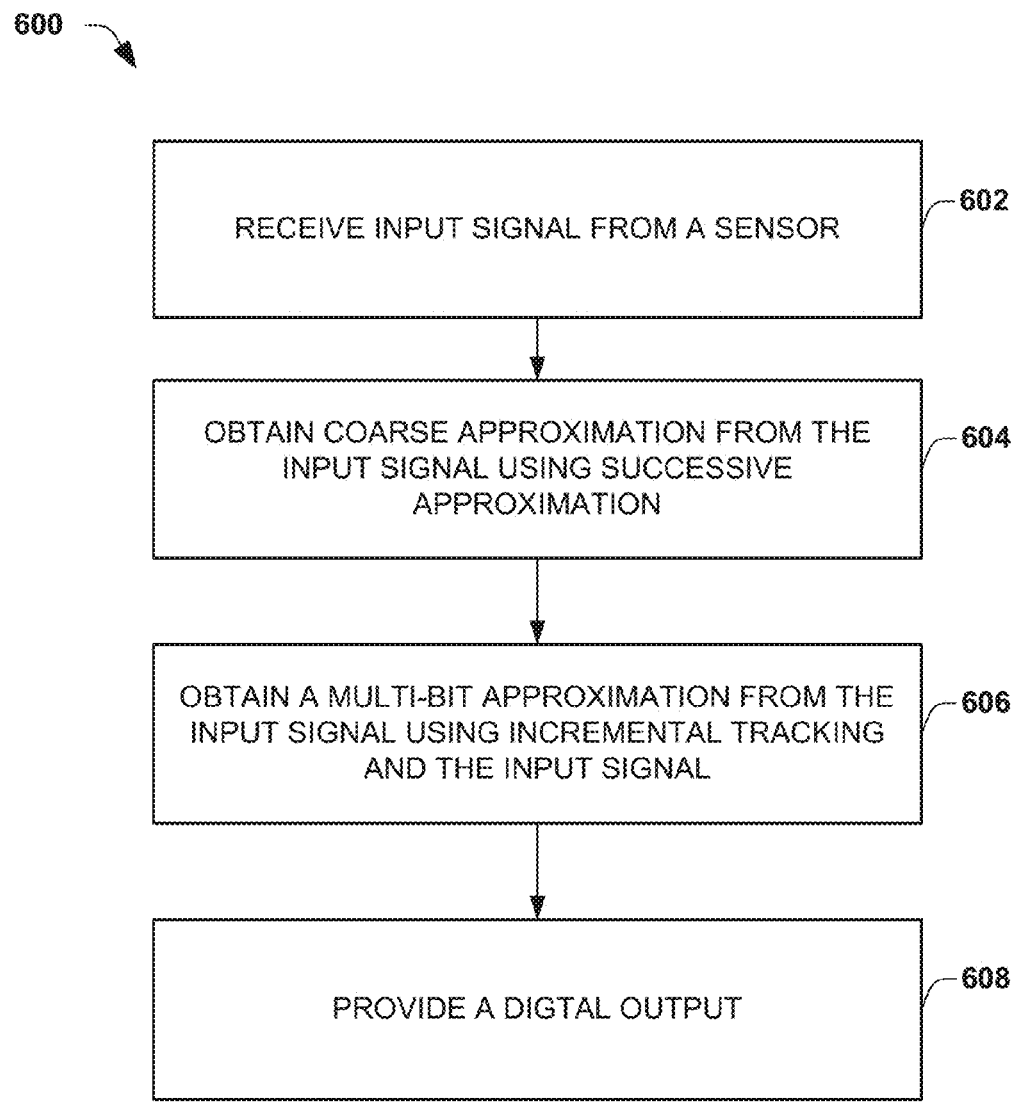
FIG. 6 is a flow diagram illustrating a method of converting a sensor value to a digital output.

FIG. 6 is a flow diagram illustrating a method 600 of converting a sensor value to a digital output. The method 600 uses multiple modes to perform the conversion with low power and low noise.

The method 600 begins at block 602, where an input signal or value is received. The input signal is from a sensor, such as a hall sensor, and remains relatively constant for a period of time. The input signal can also be generated by 2 phase or 4 phase spinning or chopping. Additionally, offsets and the like can be removed from the input signal by a chopper, such as the chopper 224 described above.

A coarse approximation is obtained from the input signal at block 604 using successive approximation tracking (SAT). The coarse approximation is at a relatively low resolution, such as 4 bits or 6 bits, and is obtained over a number of cycles.

A multi-bit incremental tracking or fine approximation is obtained from the input signal using the coarse approximation and multi-bit incremental tracking at block 606. The coarse approximation tracking is used to identify a relatively narrow reference value bandwidth. The coarse approximation operates within the identified reference bandwidth. Multiple cycles are performed to obtain the multi-bit approximation with a relatively high resolution. In one example, the multi-bit approximation is obtained with a resolution of at least 12 bits.

The multi-bit approximation is provides as a digital output or representation of the input signal at block 608. The digital output has the high resolution provided at block 607. As a result, the digital output is obtained with a high resolution with low power in a short period of time.

Figure 7:
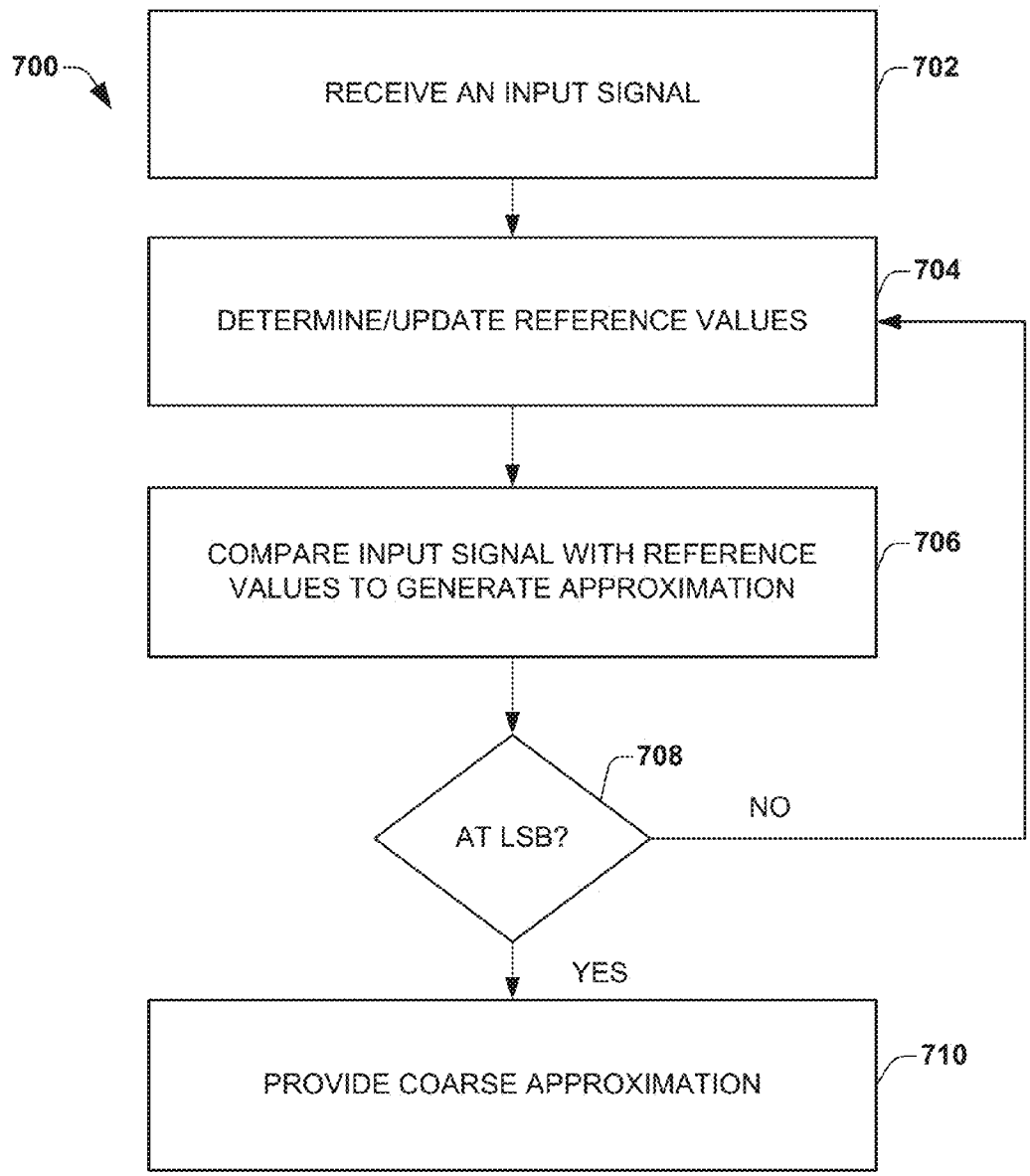
FIG. 7 is a flow diagram illustrating a method of operating an analog to digital converter in a coarse mode.

FIG. 7 is a flow diagram illustrating a method of operating an analog to digital converter in a coarse mode. In this mode, successive approximation is used to relatively quickly obtain a coarse approximation of an input signal or value.

An input signal is received at block 702. The input signal is a DC signal and is typically provided by a sensor, such as a Hall sensor. The input signal may have offsets or other unwanted noise, which can be removed by a component such as a chopper. The input signal remains relatively constant.

Reference values are determined at block 704 according to an initial value or a prior comparison approximation. The initial value for a first cycle can be a fixed predetermined value, such as a voltage or a current. Subsequent cycles use the prior comparison approximation, which is added or subtracted to the reference values in order to generate/update the reference values. Additionally, integrating capacitors, such as the capacitors 332 described above, can be configured to be disconnected from an output of a first stage.

The input signal is compared with the reference values at block 706 to generate a comparison approximation.

A determination is made on whether the comparison approximation has been performed to a selected bit or least significant bit (LSB) at 708. Each pass or cycle through the method improves the resolution by 1 bit. In one example, the approximation has been performed to an LSB of 4 bits.

Upon the comparison approximation being suitable, the comparison approximation is provided as a coarse approximation at block 710. Otherwise, the method 700 turns to block 704 for a next cycle, where the reference values are updated according to the comparison approximation.

The method 700 can continue for a set number of cycles and/or until the suitable coarse resolution is obtained.

Figure 8:
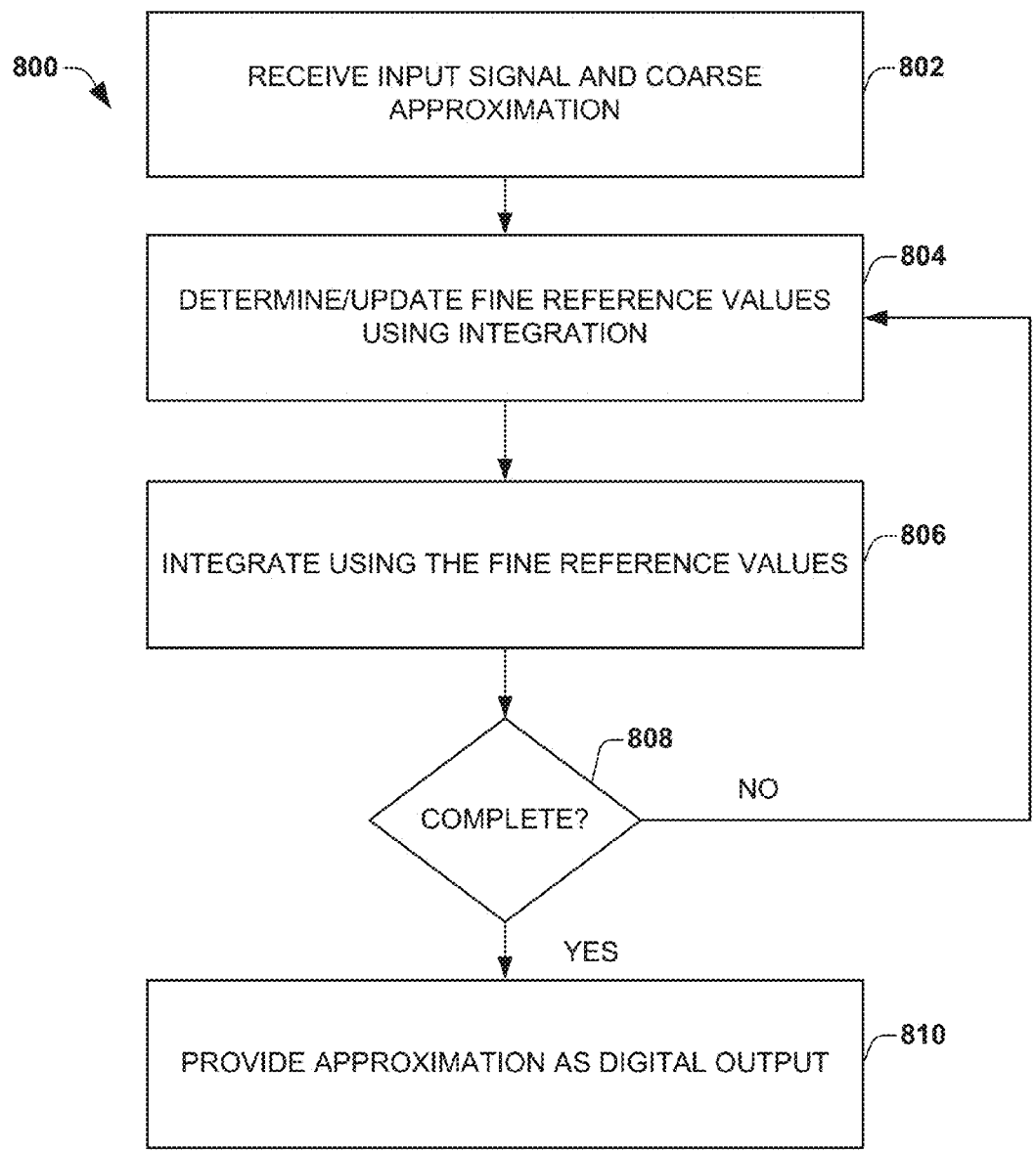
FIG. 8 is a flow diagram illustrating a method of operating an analog to digital converter in a fine mode.

FIG. 8 is a flow diagram illustrating a method of operating an analog to digital converter in a fine mode. In this mode, multi-bit incremental tracking is used to obtain a multi-bit or fine approximation of an input signal or value.

An input signal and a coarse approximation are received at block 802. The input signal is a DC signal and is typically provided by a sensor element, such as a hall sensor, magnetic sensor, temperature sensor, stress sensor, and the like. The input signal may have offsets or other unwanted noise, which can be removed by a component such as a chopper. The input signal remains relatively constant.

Reference values for the fine mode are determined at block 804 according to an initial value or a prior integration approximation. Additionally, integrating capacitors, such as the capacitors 332 described above, can be configured to be connected an output of a first stage to perform integrating functionality.

In one example, the reference values are updated based on a counter. The reference values can be made bigger by up counting and smaller by down counting. Additionally, the reference values are updatable by multiple bits, such as 3 bits, 7 bits, 12 bits, and the like. Other approaches are limited to only single bit updates.

The input signal is integrated with the reference values at block 806 to generate an integration approximation.

A determination is made on whether the integration approximation is complete at block 808. The determination of complete is typically determined after a set or selected number of cycles/steps, such as 8, 23, 256, and the like.

Once complete, the integration approximation is provided as a fine approximation at block 810. The suitable fine approximation is a digital conversion of the input signal. The suitable fine approximation is also referred to as a digital output. The digital output has a selected fine resolution and is obtained in a relatively small number of cycles of the method 800.

Upon the integration approximation not being complete, the method 800 turns to block 804 for a next cycle, where the reference values are updated according to the integration approximation.

The method 800 can continue for a set number of cycles and/or until the suitable fine resolution is obtained.

While the methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the systems/devices shown in FIGS. 1, 2, etc., are non-limiting examples of system that may be used to implement the above methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

A device for converting analog to digital is disclosed. The device includes a dual mode converter and a control unit. The dual mode converter has a coarse mode and a fine mode. The dual mode converter is configured to receive an input signal and convert the input signal to a digital output having a selected resolution. The control unit is coupled to the dual mode converter and is configured to operate the converter in the coarse mode until a coarse approximation is obtained and to operate the converter in the fine mode until a fine approximation is obtained having the selected resolution. The fine mode includes multi-bit incremental tracking.

A dual mode converter system for converting analog to digital is disclosed. The system includes a first stage, a second stage, and a digital component. The first stage is configured to receive an input signal and to successively generate a comparison output in according to coarse reference values a coarse mode and to successively generate an integration output according to fine reference values. The second stage is coupled to the first stage. The comparison output is provided as an updated coarse approximation and the integration output is provided as an updated fine approximation. The digital component is configured to update the coarse reference values using successive approximation and to update the fine reference values using multi-bit incremental tracking.

A method of converting a sensor value to a digital output is disclosed. An input signal is received. A coarse approximation of the input signal is obtained using successive approximation. A multi-bit incremental tracking approximation of the input signal is obtained using multi-bit incremental tracking and the coarse approximation.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A device for converting analog to digital, the device comprising:
    a dual mode converter having a coarse mode and a fine mode, the dual mode converter configured to receive an input signal and convert the input signal to a digital output having a selected resolution; and
    a control unit coupled to the dual mode converter and configured to operate the converter in the coarse mode until a coarse approximation is obtained and to operate the converter in the fine mode until a fine approximation is obtained having the selected resolution, wherein the fine mode includes multi-bit incremental tracking,
    wherein the control unit is configured to vary a step size employed in the coarse mode or the fine mode of the dual mode converter in a linear or non-linear manner.

2. The device of claim 1, further comprising a sensor element configured to generate the input signal, wherein the sensor element is one of a group comprising a magnetic element, a temperature element, a mechanical element, a stress element, and a voltage measurement element.

3. The device of claim 1, wherein the control unit is configured to vary the step size in the coarse mode or the fine mode in accordance with a polynomial function.

4. The device of claim 1, wherein the control unit is configured to vary the step size in the coarse mode or the fine mode in accordance with a counter, and wherein the control unit is configured to alter a count value of the counter by a value $+/-2^K$ for K≥0, wherein K is an integer.

5. The device of claim 1, wherein the control unit is configured to vary the step size non-linearly based on a prior history of comparator decisions within the dual mode converter in either the coarse mode or the fine mode.

6. The device of claim 1, wherein the dual mode converter comprises a different dual mode converter or a single-ended dual mode converter.

7. A device for converting analog to digital, the device comprising:
    a dual mode converter having a coarse mode and a fine mode, the dual mode converter configured to receive an input signal and convert the input signal to a digital output having a selected resolution; and
    a control unit coupled to the dual mode converter and configured to operate the converter in the coarse mode until a coarse approximation is obtained and to operate the converter in the fine mode until a fine approximation is obtained having the selected resolution, wherein the fine mode includes multi-bit incremental tracking,
    wherein the dual mode converter comprises a digital to analog converter configured to receive feedback from the control unit and generate one or more reference values for a comparison operation within the dual mode converter.

8. The device of claim 7, wherein the digital to analog converter (DAC) comprises a current steering type DAC or a voltage type DAC.

9. The device of claim 8, wherein the DAC comprises the current steering type DAC and comprises dynamic element matching circuitry in generating the one or more reference values.

10. The device of claim 7, wherein the dual mode converter comprises a different dual mode converter or a single-ended dual mode converter.

11. A dual mode converter comprising:
a first stage configured to successively generate a comparison output according to coarse reference values in a coarse mode and to successively generate an integration output according to fine reference values in a fine mode;
a second stage coupled to the first stage, wherein the comparison output is provided as an updated coarse approximation and the integration output is provided as an updated fine approximation; and
a digital component configured to update the coarse reference values using successive approximation and to update the fine reference values using multi-bit incremental tracking,
wherein the digital component comprises multi-bit incremental logic circuitry in parallel with a feedforward path that are collectively activated in the fine mode.

12. The converter of claim 11, wherein the first stage includes integrating, switchable capacitors configured to generate the integration output.

13. The converter of claim 11, wherein the second stage includes a latch clocked by a synchronous clock.

14. The converter of claim 11, wherein the digital component includes successive approximation logic configured to update the coarse reference values in the coarse mode.

15. The converter of claim 14, wherein the successive approximation logic is selectively activated in the coarse mode, and selectively deactivated in the fine mode.

16. The converter of claim 11, further comprising a current steering component coupled to the digital component and configured to generate and provide steering values including the coarse reference values and the fine reference values to the first stage.

17. The converter of claim 16, wherein the digital component is configured to generate the coarse reference values and the fine reference values, and wherein the digital component is configured to vary a step size of the coarse or fine reference values employed in the coarse mode or the fine mode, respectively, in a linear or a non-linear fashion.

18. The converter of claim 16, wherein the digital component is configured to generate the coarse reference values and the fine reference values, and wherein the digital component is configured to vary a step size of the coarse or fine reference values in either the coarse mode or the fine mode, respectively, in accordance with a counter, and wherein the digital component is configured to alter a count value of the counter by a value $+/-2^K$ for $K \geq 0$, wherein K is an integer.

19. The converter of claim 16, wherein the digital component is configured to generate the coarse reference values and the fine reference values, and wherein the digital component is configured to vary a step size of the coarse or fine reference values in either the coarse mode or the fine mode, respectively, wherein the digital component is configured to vary the step size non-linearly based on a prior history of comparator decisions within the dual mode converter in either the coarse mode or the fine mode.

* * * * *